(12) United States Patent
Bhat et al.

(10) Patent No.: US 11,437,923 B2
(45) Date of Patent: Sep. 6, 2022

(54) VARIABLE RESONANT POWER CONVERTER WITH TUNABLE INDUCTOR

(71) Applicant: Hamilton Sundstrand Corporation, Charlotte, NC (US)

(72) Inventors: Ishwar Bhat, Karnataka (IN); Piyush Nilchandra Waghmare, Bangalore (IN)

(73) Assignee: HAMILTON SUNDSTRAND CORPORATION—PCSS, Charlotte, NC (US)

( * ) Notice: Subject to any disclaimer, the term of this patent is extended or adjusted under 35 U.S.C. 154(b) by 37 days.

(21) Appl. No.: 15/482,314

(22) Filed: Apr. 7, 2017

(65) Prior Publication Data
US 2018/0234024 A1    Aug. 16, 2018

(30) Foreign Application Priority Data
Feb. 13, 2017   (IN) .............................. 201711005087

(51) Int. Cl.
*H02M 7/04*    (2006.01)
*H02M 3/337*    (2006.01)
(Continued)

(52) U.S. Cl.
CPC .............. *H02M 7/04* (2013.01); *B64D 47/00* (2013.01); *H02M 1/4241* (2013.01);
(Continued)

(58) Field of Classification Search
CPC .................. H02M 3/337; H02M 3/335; H02M 2007/4818; H02M 7/04; H02M 1/4241;
(Continued)

(56) References Cited

U.S. PATENT DOCUMENTS 2,301,871 A * 11/1942 Hanert ..................... G10H 1/00
                                                                331/106
3,259,861 A    7/1966 Walker
(Continued)

FOREIGN PATENT DOCUMENTS

| CN | 1523370 A | 8/2004 | |
| JP | S6412284 A | 1/1989 | |
| WO | WO-2018079967 A1 * | 5/2018 | ............. H01F 21/04 |

OTHER PUBLICATIONS

Costa Valter S. et al. "Evaluation of a variable-inductor-controlled LLC resonant converter for battery charging applications" IECON 2016—42nd Annual Conference of the IEEE Industrial Electornics Society, IEEE Oct. 23, 2016 pp. 2633-2638.
(Continued)

*Primary Examiner* — Yusef A Ahmed
(74) *Attorney, Agent, or Firm* — Cantor Colburn LLP

(57) ABSTRACT

An electronic power converter is configured to receive power from a power source. The power operates at a switching frequency. The electronic power converter includes a resonant tank circuit operatively connected to the power converter. The resonant tank circuit operates at a tank resonant frequency. The electronic power converter includes a controller operatively connected to the resonant tank circuit. The electronic power converter further includes a variable inductor operatively connected to the resonant tank circuit. The variable inductor is configured to modify the tank resonant frequency to match the switching frequency within a predetermined margin.

4 Claims, 3 Drawing Sheets

(51) Int. Cl.
  *H03J 5/00* (2006.01)
  *B64D 47/00* (2006.01)
  *H02M 1/42* (2007.01)
  *H03J 1/00* (2006.01)
  *H02M 1/00* (2006.01)
  *H02M 7/48* (2007.01)

(52) U.S. Cl.
  CPC ............ *H02M 3/3376* (2013.01); *H03J 5/00* (2013.01); *H02M 1/0058* (2021.05); *H02M 7/4818* (2021.05); *H03J 1/00* (2013.01); *Y02B 70/10* (2013.01)

(58) Field of Classification Search
  CPC .............. H02M 1/0058; H02M 7/4818; G01R 19/16338; G01R 31/42; Y02B 70/1425; Y02B 70/1433; Y02B 70/10; B64D 47/00; H03J 5/00; H03J 1/00
  See application file for complete search history.

(56) References Cited

U.S. PATENT DOCUMENTS

| | | | | |
|---|---|---|---|---|
| 4,268,822 | A * | 5/1981 | Olsen | H04Q 9/08 340/7.49 |
| 4,551,690 | A * | 11/1985 | Quist | H03J 7/02 331/36 L |
| 4,896,091 | A * | 1/1990 | Kislovski | H02P 13/12 363/91 |
| 5,194,817 | A * | 3/1993 | Ward | G01R 31/1272 324/544 |
| 5,684,678 | A * | 11/1997 | Barrett | H02M 3/3376 363/17 |
| 6,317,337 | B1 * | 11/2001 | Yasumura | H02M 3/3385 363/21.04 |
| 6,388,902 | B1 * | 5/2002 | Yasumura | H02M 3/3385 363/21.02 |
| 6,577,510 | B1 * | 6/2003 | Yasumura | H02M 3/3385 363/21.02 |
| 6,587,358 | B1 * | 7/2003 | Yasumura | H02M 3/33523 363/21.02 |
| 6,687,137 | B1 * | 2/2004 | Yasumura | H02M 3/33507 363/21.01 |
| 7,953,369 | B2 * | 5/2011 | Baarman | H02M 3/33569 307/145 |
| 8,184,456 | B1 * | 5/2012 | Jain | H02M 5/29 363/21.02 |
| 8,339,812 | B2 | 12/2012 | Martini et al. | |
| 8,456,868 | B2 | 6/2013 | He et al. | |
| 8,711,584 | B2 * | 4/2014 | Zhang | H02M 1/36 363/21.13 |
| 9,246,356 | B2 * | 1/2016 | Baarman | H02M 3/33523 |
| 9,362,835 | B2 | 6/2016 | Xu et al. | |
| 10,917,017 | B1 * | 2/2021 | McFarland | H02M 3/33507 |
| 2002/0060621 | A1 * | 5/2002 | Duffy | H01F 29/14 336/198 |
| 2005/0068792 | A1 * | 3/2005 | Yasumura | H02M 3/33592 363/21.06 |
| 2005/0152161 | A1 * | 7/2005 | Cheung | H02M 3/337 363/20 |
| 2011/0248812 | A1 * | 10/2011 | Hu | H01F 29/14 336/221 |
| 2012/0039378 | A1 * | 2/2012 | Nakayama | H03L 7/08 375/226 |
| 2013/0099590 | A1 * | 4/2013 | Ma | H02M 3/3388 307/104 |
| 2013/0099787 | A1 * | 4/2013 | Lu | H02M 3/3376 324/319 |
| 2014/0191568 | A1 * | 7/2014 | Partovi | H02J 50/80 307/31 |
| 2015/0229200 | A1 * | 8/2015 | Schwartz | H02M 3/33592 363/21.03 |
| 2015/0263640 | A1 * | 9/2015 | Russell | H02M 1/32 363/126 |
| 2015/0296302 | A1 | 10/2015 | Pircaro | |
| 2015/0302982 | A1 * | 10/2015 | Meyer | H01F 21/06 336/105 |
| 2016/0049877 | A1 * | 2/2016 | Kang | H02M 3/337 363/21.04 |
| 2016/0077142 | A1 * | 3/2016 | Kanayama | G01R 31/42 324/750.3 |
| 2016/0181875 | A1 * | 6/2016 | Long | H02J 50/90 320/108 |
| 2017/0179933 | A1 * | 6/2017 | Garrity | H01F 38/14 |
| 2017/0181227 | A1 * | 6/2017 | Ignatowski | H05B 6/08 |
| 2019/0068071 | A1 * | 2/2019 | Jia | H02M 3/3376 |
| 2020/0382010 | A1 * | 12/2020 | Beddingfield | H03K 4/94 |
| 2020/0388427 | A1 * | 12/2020 | Buono | H03F 3/217 |
| 2020/0388435 | A1 * | 12/2020 | Buono | H01F 27/34 |
| 2021/0159803 | A1 * | 5/2021 | Waghmare | H02M 3/01 |
| 2022/0109361 | A1 * | 4/2022 | Johnson | H02K 33/18 |

OTHER PUBLICATIONS

European Search Report for Application No. 18156439.4-1201 dated May 14, 2018, 9 pages.
Park Ki-Hyeon et al. "A novel adaptive magnetizing inductance control scheme for high-efficiency LLC resonant converter for PV applications", 2015 17th European Conference on Power Electronics and Applications (EPE 15 ECCE-EUROPE), Jointly owned by EPE Association and IEEE Pels, Sep. 8, 2015, pp. 1-10.

* cited by examiner

# VARIABLE RESONANT POWER CONVERTER WITH TUNABLE INDUCTOR

FOREIGN PRIORITY

This application claims priority to India Patent Application No. 201711005087, filed Feb. 13, 2017, and all the benefits accruing therefrom under 35 U.S.C. § 119, the contents of which in its entirety are herein incorporated by reference.

BACKGROUND

Exemplary embodiments pertain to the art of solid state power distribution systems, and more particularly to a variable resonant power converter with a tunable inductor.

Power supplies can experience heat energy loss generated by frequency switching and magnetics in the switch mode converters. In AC power systems, the switching frequency is different from the resonant frequency. Each change of switching frequency can change the power characteristics of the circuit. If the resonant frequency of the switch becomes more and more different from the resonant frequency the source frequency, the disparate resonance creates inefficiency due to heat loss. If output load or input voltages change, the efficiency of the power supply can be affected due to heat loss from each frequency change.

BRIEF DESCRIPTION

Disclosed is an electronic power converter configured to receive power from a power source. The power operates at a switching frequency. The electronic power converter further includes a resonant tank circuit operatively connected to the power converter. The resonant tank circuit operates at a tank resonant frequency. The electronic power converter includes a controller operatively connected to the resonant tank circuit. The electronic power converter further includes a variable inductor operatively connected to the resonant tank circuit. The variable inductor is configured to modify the tank resonant frequency to match the switching frequency within a predetermined margin.

Also disclosed is a method for converting electronic power. The method includes receiving power from a power source operating at a switching frequency. The method further includes transmitting the power to a variable inductor operatively connected to a resonant tank circuit. The resonant tank circuit operates at a tank resonant frequency. The method further includes modifying, via a controller operatively connected to the resonant tank circuit, the tank resonant frequency to match the switching frequency within a predetermined margin.

BRIEF DESCRIPTION OF THE DRAWINGS

The following descriptions should not be considered limiting in any way. With reference to the accompanying drawings, like elements are numbered alike.

A detailed description of one or more embodiments of the disclosed apparatus and method are presented herein by way of exemplification and not limitation with reference to the Figures.

DETAILED DESCRIPTION

Figure 1:
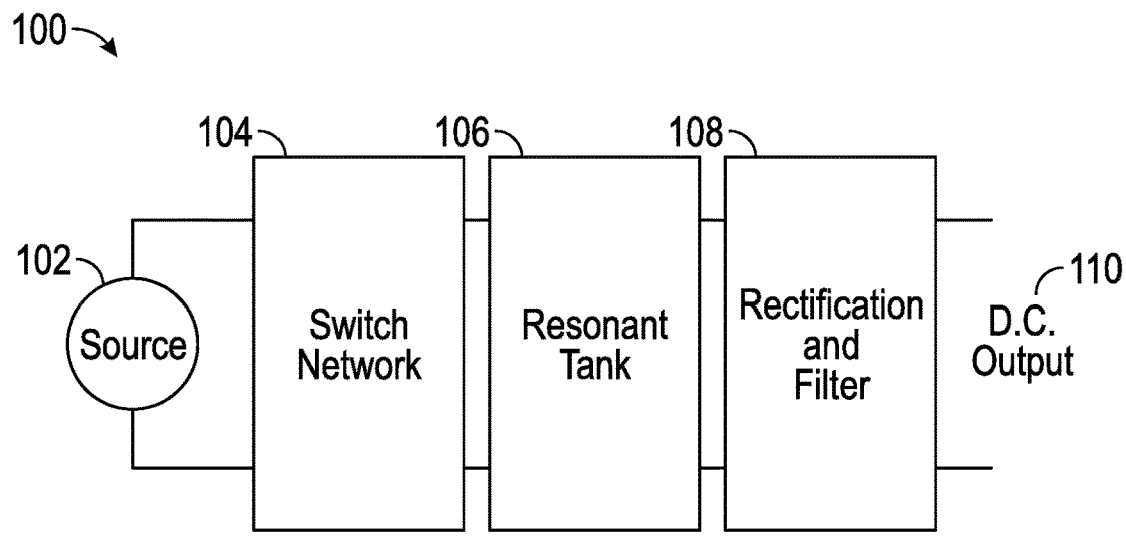
FIG. 1 is block diagram of a power conversion system for a switch mode converter.

FIG. 1 depicts a block diagram of a power conversion scheme 100 for a switch mode converter. In general, a power converter can include a power source 102, operatively connected to a switch network 104, a resonant tank 106 connected with switch network 104, and a rectification and filter portion 108 connected with resonant tank circuit 106. Switch mode converters like power conversion scheme 100 can experience losses from switching and magnetics when switching from one conversion portion to the next. Some switching schemes may vary the switching frequency to regulate the output load at load 110. As the resonant frequency becomes disparate due to changes in the load or voltage at DC output 110, the power transferred to load 110 can increase and the reactive part of the power is minimized Thus, the power available to be transferred to the load may be reduced, and the overall efficiency may be reduced.

In general, inefficiencies are expressed with heat generation by the system. Efficiencies for power converters are generally higher as they become closer to the resonant frequencies experienced at each adjacent step of the switching apparatus. Some systems may include varying the DC voltage at output 110 and the load changes. Other systems may control switching frequency using a voltage control loop and a current control loop, but may not target high efficiency by coordinating the tank circuit to match switching frequency. Further approaches have included adding or subtracting flux in an inductor coil to change inductance of a tank circuit. But some applications with weight and space constraints (e.g., aeronautical applications) may not allow addition of additional inductor coils to modify inductance. Moreover, some systems may not provide for infinitely variable inductance adjustments based on voltage and load changes.

For high power applications used in aircraft, power efficiency increase as the AC system resonant frequency approach the switching frequencies. It is advantageous, then, to keep the resonant frequencies within a predetermined margin of difference without increasing physical space and weight needed to accommodate additional coils for inductors. For example, if an AC system resonates at 100 kHz, the switching frequency is controlled to be between 100 kHz to 105 kHz. In some aspects, a fully optimized switching frequency may be within 7% of the AC system. Maintaining this relatively narrow margin of switching frequency disparity between the AC system and the switch may be difficult due to changing loads and voltages. An infinitely tunable inductance provides fine adjustment in real time to compensate for dynamic system changes.

Figure 2:
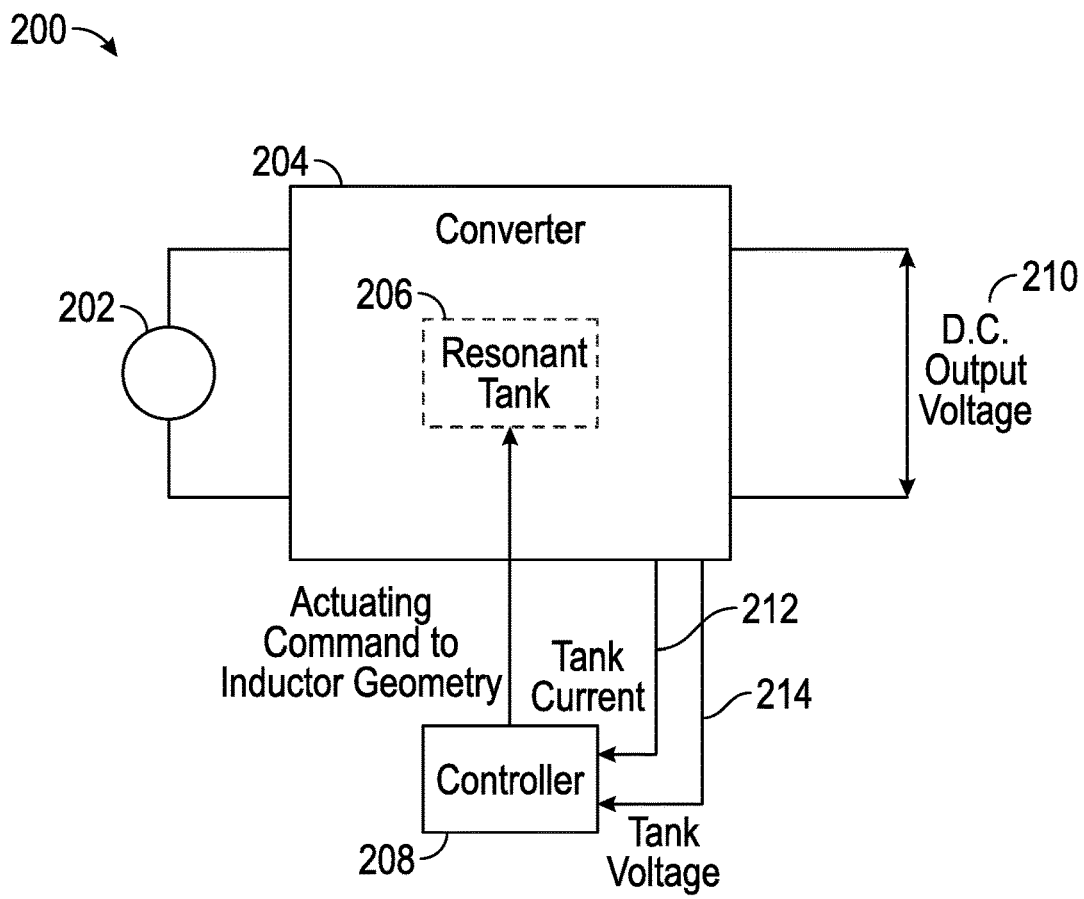
FIG. 2 depicts a variable resonant power converter with a tunable inductor, according to one embodiment.

FIG. 2 depicts a variable resonant power converter with a tunable inductor 200 (hereafter "system 200") according to one embodiment. Referring now to FIG. 2, system 200 includes a power source 202 operatively connected to a converter 204. A controller 208 is operatively connected to converter 204, and configured to send actuation commands to a variable inductor in a resonant tank circuit 206. The actuation commands are configured to change an inductance of tank circuit 206.

In some aspects, controller 208 may be a microcontroller or a field-programmable gate array (FPGA). Controller 208 may be configured to control the resonant frequency of system 200 to be within a predetermined threshold of difference from the AC source resonant frequency by varying the tunable inductor. For example, a predetermined threshold may be 1% difference between the resonant frequencies, 2% difference, etc. Converter 204 provides feedback to controller 208 that includes a tank current feedback 212 and a voltage control feedback 214. Controller 208 may dynamically control the tank resonant frequency of the tank circuit based on voltage control feedback 214 and tank current feedback 212, and the resonant frequencies of the AC source and the tank circuit.

Power source 202 can be a high voltage DC source in an aircraft such as, for example, a 240 V rectifier. Power source 202 operates at its own predetermined frequency, which may be static or may change dynamically based on operational factors of the vehicle in which it operates. As one exemplary application, system 200 reduces the 240 V input to a 28 V output. In other aspects, controller 208 may vary the resonant frequency based on tank current feedback 212 and tank voltage feedback 214 to change the resonant network characteristics for fixed value of C. By altering the inductance L in the resonant tank circuit 206, controller 208 may alter the tank frequency of the resonant tank circuit 206 to be closer to the circuit switching frequency, thereby keeping the behavior of system 200 constant under varying load conditions at DC output 210.

Figure 3:
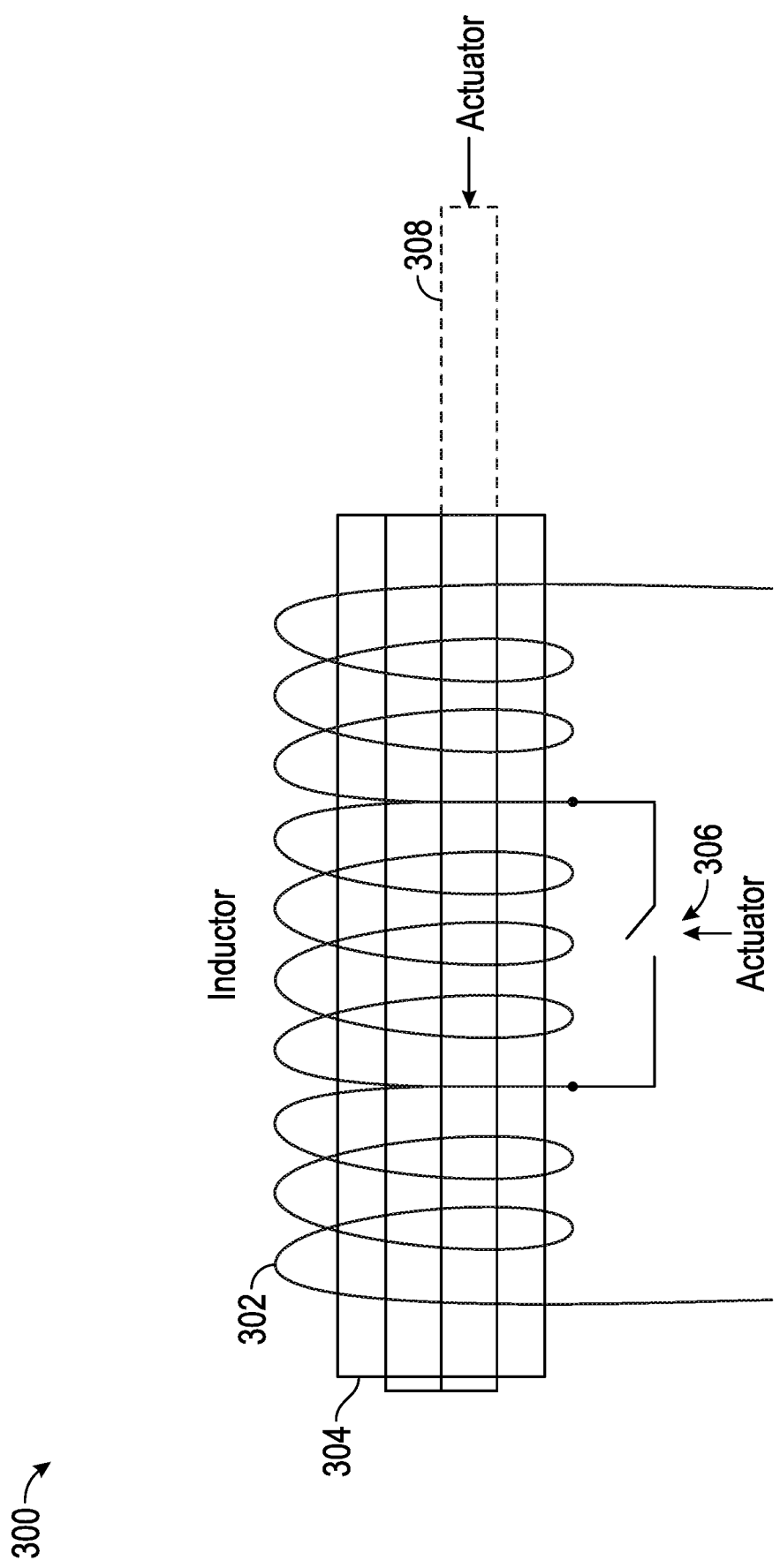
FIG. 3 depicts a variable inductor having infinitely variable inductance for a resonant tank, according to one embodiment.

According to some embodiments, controller 208 can change the inductance by modifying the turns in an inductance coil operating as part of resonant tank circuit 206. FIG. 3 depicts a variable inductor 300 having infinitely variable inductance for resonant tank circuit 206, according to one embodiment. Variable inductor 300 may be part of the resonant tank circuit 206 circuit, according to some embodiments. Variable inductor 300 includes an inductor core 304, and a plurality of inductor coil loops 302.

According to one embodiment, variable inductor 300 may further include one or more coil switches 306 configured to connect a predetermined number of loops of inductor coil loops 302 to short a number of loops. By shorting the current path, coil switch 306 may vary the flux density created by variable inductor 300 as current passes through inductor coil loops 302.

According to another embodiment, variable inductor 300 may further include an actuator 308 configured to slide laterally along a centerline of a cavity within inductor core 304. For example, inductor core 304 may be a tube of inductor core material configured to receive actuator 308 in infinitely variable amounts of engagement from no engagement to full engagement that inserts the entire length of actuator 308 into inductor core 304. As actuator 308 increasingly engages inductor core 304, inductance is varied according to a position of engagement.

Accordingly, in some aspects, controller 208 may receive tank current feedback 212 and tank voltage feedback 214, determine a difference between an AC resonant frequency and the switch resonant frequency, and modify an inductance of variable inductor 300 until a margin between the AC resonant frequency and the switch resonant frequency is within a predetermined threshold.

According to other embodiments, controller 208 may actuate one or more coil switches 306 to modify the inductance of variable inductor 300.

According to another embodiment, controller 208 may modify a position of an actuator bar to modify the inductance of variable inductor 300.

In another embodiment, controller may modify a position of an actuator bar and actuate one or more coil switches 306.

Accordingly, aspects of variable inductor 300 may alter the inductance of resonant tank circuit 206 to move the resonant frequency closer to the switching frequency, thereby keeping the behavior of the circuit constant under varying load conditions. Controller 208 may modify inductance by adding or subtracting operable turns in the coil via the one or more coil switches 306, or varying the flux density in the core by moving the actuator core out of magnetic circuit, or by using both of the one or more coils switches 306 and the movable bar of actuator 308.

Figure 4:
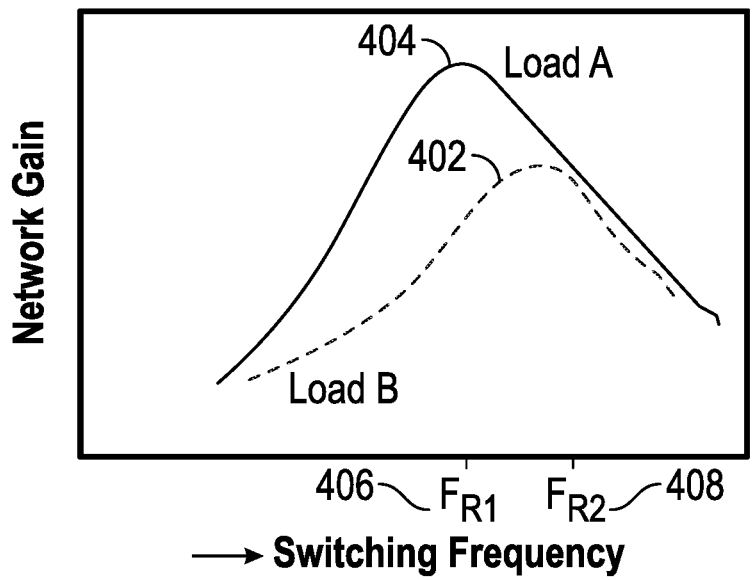
FIG. 4 is a graph of switching characteristics of a converter (fixed tank values) with changing frequencies under two different loads.

FIG. 4 is a graph of switching characteristics of a converter with changing frequencies under two different load conditions 402 and load condition 404. FIG. 4 shows the behavior of the network gain for varying switching frequencies (e.g., Frequency 1 406 and Frequency 2 408) under different load conditions without dynamic adjustment of inductance. Since many aircraft loads are dynamic, a converter that's operating at optimized efficiency (demonstrated by peak in network gain 404) at one load condition 406 may not be optimal at another load condition 408.

Figure 5:
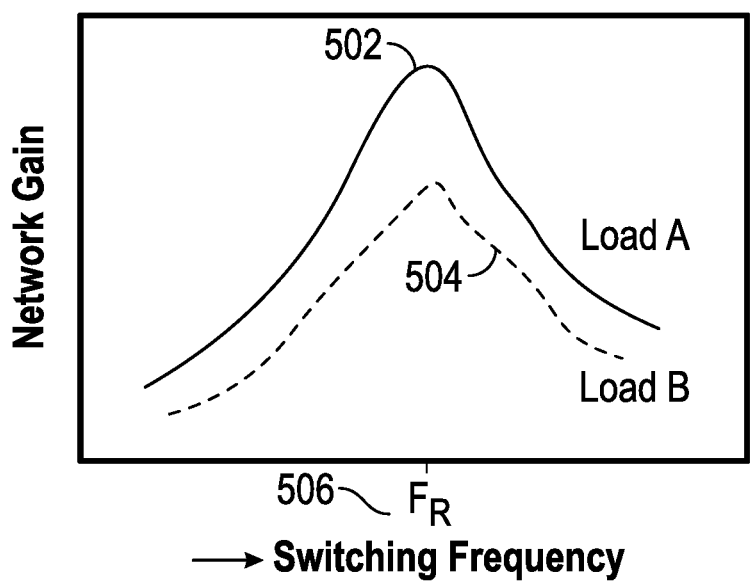
FIG. 5 is a graph of switching characteristics of a converter (tuned tank values) with changing frequencies under two different loads, according to one embodiment.

FIG. 5 is a graph of switching characteristics of a converter with changing frequencies under two different loads, according to one embodiment. According to one embodiment, controller 208 may alter the inductance of resonant tank circuit 206 to move the tank resonant frequency 506 closer to the switching frequency (not shown) thereby keeping the behavior of the circuit constant under varying load conditions. For example, controller 208 may modify the flux density in inductor core 304, which may maximize the network gain under every load condition with dynamic control of variable inductor 300.

Embodiments of the present disclosure include controller logic that varies the inductance present in tank circuit of any resonant power supply via a variable inductor. A precise movement of a controllable moving element of the variable inductor can be driven by closed-loop control logic implemented with the controller to tune the tank circuit. In some aspects, precise and infinitely variable control of the inductance results in precision control of the resonance frequency at each power conversion stage to achieve targeted efficiency.

Aspects of the present invention may increase power conversion efficiency. For example, some embodiments can allow tuning of the LC tank frequency to a target threshold based on the load and input line change, and deliver power to the load with a very high efficiency ranging from 98 to 99%.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic power converter comprising:
   a power converter that receives power from a power source, wherein the power source operates at a switching frequency;
   a resonant tank circuit operatively connected to the power converter, wherein the resonant tank circuit operates at a tank resonant frequency;
   a controller operatively connected to the resonant tank circuit; and
   a variable inductor operatively connected to the resonant tank circuit and the controller, wherein in operation the controller changes an inductance of the variable inductor based on the switching frequency such that it modifies the tank resonant frequency to match the switching frequency within a predetermined margin;
   wherein the variable inductor comprises:
   an inductor core having a cavity extending along a length of the inductor core;
   a plurality of serially connected inductor coils wrapped around the inductor core;
   one or more core switches connected between two predetermined portions of the inductor coils wrapped around the inductor core; and
   an actuator comprising a movable core bar configured to slide laterally along a centerline of the cavity within the inductor core;
   wherein the controller is configured to:
   determine a target inductance adjustment based on the switching frequency and the tank resonant frequency;
   modify, via the variable inductor, an inductance of the resonant tank circuit until the tank resonant frequency matches the switching frequency within the predetermined margin, wherein modifying the inductance of the resonant tank circuit includes providing control signals to the one or more core switches that cause the one or more control switches to open or close and thereby add or subtract a number of operable turns in the plurality of serially connected inductor coils surrounding the inductor core of the variable inductor;
   receive, from the resonant tank circuit, a resonant tank current;
   receive, from the resonant tank circuit, a resonant tank voltage;
   modify the inductance of the resonant tank circuit based on the resonant tank current, the resonant tank voltage, the switching frequency, and the tank resonant frequency; and
   modify the inductance of the resonant tank circuit via the actuator by changing an infinitely variable amount of engagement that varies from no engagement of the movable core bar into the inductor core to a full engagement of the movable core bar, wherein the inductance of the variable inductor is varied according to the amount of engagement.

2. The electronic power converter of claim 1, wherein the predetermined margin is less than or equal to 7%.

3. A method of converting electronic power comprising:
   receiving, at a power converter, power from a power source operating at a switching frequency;
   transmitting the power to a variable inductor operatively connected to a resonant tank circuit, wherein the variable inductor includes one or more core switches connected between two predetermined portions of serially connected inductor coils wrapped around an inductor core of the variable inductor, wherein the resonant tank circuit operates at a tank resonant frequency that is based on an inductance of the variable inductor;
   determining, via a controller, a target inductance adjustment based on the switching frequency and the tank resonant frequency;
   providing control signals from the controller to the one or more core switches that cause the one or more core switches to open or close and thereby add or subtract a number of operable turns in the serially connected inductor coils surrounding the inductor core of the variable inductor so that an inductance of the resonant tank circuit matches the target inductance;
   receiving, via the controller, a resonant tank current from the resonant tank circuit;
   receiving, via the controller, a resonant tank voltage from the resonant tank circuit; and
   modifying, via the controller, the inductance of the resonant tank circuit based on the resonant tank current, the resonant tank voltage, the switching frequency, and the tank resonant frequency;
   wherein the inductance of the resonant tank circuit is modified via an actuator comprising a movable core bar configured to slide laterally along a centerline of a cavity within the inductor core by changing an infinitely variable amount of engagement that varies from no engagement of the movable core bar into the inductor core to a full engagement of the movable core bar, wherein inductance of the variable inductor is varied according to the amount of engagement.

4. The method of claim 3, wherein the predetermined margin is less than or equal to 7%.

* * * * *